United States Patent [19]

Makita

[11] Patent Number: 5,696,590
[45] Date of Patent: Dec. 9, 1997

[54] POSITION CONTROL METHOD POSITION CONTROL APPARATUS, AND SEMICONDUCTOR MANUFACTURING APPARATUS

[75] Inventor: Yoshinori Makita, Utsunomiya, Japan

[73] Assignee: Canon Kabushiki Kaisha, Tokyo, Japan

[21] Appl. No.: 677,194

[22] Filed: Jul. 9, 1996

[30] Foreign Application Priority Data

Jul. 13, 1995 [JP] Japan .................. 7-177371

[51] Int. Cl.$^6$ .................................................. G01B 11/00
[52] U.S. Cl. .................... 356/399; 356/400; 356/401
[58] Field of Search .............................. 356/399, 400, 356/401; 250/492.1, 492.23

[56] References Cited

U.S. PATENT DOCUMENTS 4,326,805  4/1982  Feldman .................. 356/399
4,579,453  4/1986  Makita .................... 356/375
4,659,227  4/1987  Sato et al. ................ 356/399
4,717,257  1/1988  Kaneta et al. ............. 356/349

Primary Examiner—Frank G. Font
Assistant Examiner—Reginald A. Ratliff
Attorney, Agent, or Firm—Fitzpatrick, Cella, Harper & Scinto

[57] ABSTRACT

A position detection error generated due to the response delay of a position measuring device is corrected so as to essentially improve the relative position alignment performance of a moving member. In a position control method for controlling a moving member 15 (25) to target positions generated at predetermined periods, the current position of the moving member is measured by a position measuring device 16 (26), and a value corresponding to the detection error of the current position of the moving member due to the detection delay of the position measuring device is subtracted, as a correction amount $O_w$ ($O_r$) of the current position of the moving member, from the value of a target position command signal $X_w$ ($X_r$).

27 Claims, 6 Drawing Sheets

POSITION CONTROL METHOD POSITION CONTROL APPARATUS, AND SEMICONDUCTOR MANUFACTURING APPARATUS

BACKGROUND OF THE INVENTION

The present invention relates to a position control method and apparatus, and a semiconductor manufacturing apparatus using the same and, more particularly, to a position control method and apparatus, which are applied to the position control of a semiconductor manufacturing apparatus such as an exposure apparatus for exposure-transferring a pattern on a reticle or mask onto a substrate such as a semiconductor wafer in the semiconductor manufacturing process, a high-precision NC machine or a high-precision inspection apparatus which must move an object to be processed or an object to be inspected at high speed, and the like.

In a so-called step-and-scan type exposure apparatus used in the manufacture of semiconductor devices, as shown in FIG. 5, the position control of a wafer stage 15 and a reticle stage 25 is attained by a position control apparatus shown in, e.g., FIG. 6.

Referring to FIGS. 5 and 6, reference numeral 10 denotes a wafer stage position control unit; and 15, a wafer stage which moves in the X direction and/or the Y direction. On the wafer stage 15, a wafer chuck 51 for holding a wafer 50 is placed. The wafer stage position control unit 10 comprises a motor 14 for moving the wafer stage 15, and a position measuring device 16 such as a laser length measuring device, which measures the current position of the wafer stage 15 using a mirror 53 fixed on the upper portion of the wafer stage 15 and outputs a current position signal $P_w$ of the wafer stage 15.

The wafer stage position control unit 10 comprises a subtracter 11 which receives the current position signal $P_w$ of the wafer stage 15 and a target position command signal $X_w$ generated at a predetermined period, and outputs a position deviation signal $E_w$, a position amplifier 12 which receives the position deviation signal $E_w$, performs a filter calculation, a PID calculation, and various gain and phase compensation calculations, and outputs a current command signal $C_w$, and a driver amplifier 13 which receives the current command signal $C_w$, amplifies a current, and outputs a motor current $I_w$ to the motor 14.

Referring to FIGS. 5 and 6, reference numeral 20 denotes a reticle stage position control unit; and 25, a reticle stage which moves in the X direction and/or the Y direction. On the upper portion of the reticle stage 25, a reticle 48 is held. The reticle stage position control unit 20 comprises a motor 24 for moving the reticle stage 25, and a position measuring device 26 such as a laser length measuring device, which measures the current position of the reticle stage 25 using a mirror 52 fixed to the reticle stage 25 and outputs a current position signal $P_r$ of the reticle stage 25.

The reticle stage position control unit 20 comprises a subtracter 21 which receives the current position signal $P_r$ of the reticle stage 25 and a target position command signal $X_r$ generated at a predetermined period, and outputs a position deviation signal $E_r$, a position amplifier 22 which receives the position deviation signal $E_r$, performs a filter calculation, a PID calculation, and various gain and phase compensation calculations, and outputs a current command signal $C_r$, and a driver amplifier 23 which receives the current command signal $C_r$, amplifies a current, and outputs a motor current $I_r$ to the motor 24.

In FIG. 5, reference numeral 41 denotes an exposure light source for generating exposure light used for exposure-transferring a pattern on the reticle 48 onto the wafer 50; 42, a shutter which is pivoted by a motor 43 and controls the start and end timings of exposure; 44, an optical element; 45, a mirror for reflecting the exposure light; 46, a photosensor for monitoring the intensity of the exposure light; and 47, a condenser lens for irradiating the exposure light onto a predetermined region of the reticle 48.

A host computer (not shown) sets time-serial target position command signals $X_w[i]$ (i=1, 2, 3, . . . , n) and $X_r[i]$ (i=1, 2, 3, . . . , n) in a position command sequence output unit 2 shown in FIG. 6. The position command sequence output unit 2 outputs the target position command signals $X_w[i]$ of the wafer stage 15 and the target position command signals $X_r[i]$ of the reticle stage 25 to the wafer and reticle stage control units 10 and 20 in accordance with clock signals generated by a clock generator 1 at predetermined periods $\Delta t$.

The target position command signals $X_r[i]$ of the reticle stage 25 set coordinates used for scanning the exposure region of the reticle 48 in the X direction, and the target position command signals $X_w[i]$ of the wafer stage 15 set coordinates used for scanning the exposure region of one exposure shot in the X direction in synchronism with the reticle stage 25.

When these target positions are sequentially output, the reticle and wafer stages 25 and 15 synchronously move at a 4:1 magnification as the reduction magnification of a reduction projection lens 49 of the semiconductor exposure apparatus.

In this example, in order to minimize the relative position error between the wafer and reticle stages 15 and 25, the position deviation signal $E_w$ of the wafer stage 15 is subjected to $xK_1$ magnification conversion in a magnification correction calculation unit 3 to obtain a position deviation signal $E_{rw}$, which is input to an adder 4 in the reticle stage position control unit 20.

This control method is a popular synchronous control method and is called "master/slave control". The above-mentioned position deviation signals are expressed by the following simple equations (1) and (2) including additions and subtractions:

$$E_w = X_w - P_w \quad (1)$$

$$E_r = X_r - P_r - E_{rw} = X_r - P_r - K_1 \times E_w \quad (2)$$

where $K_1$ is the magnification corrected in the magnification correction calculation unit 3, and is the reciprocal of the reduction ratio of the reduction exposure lens 49.

In this example, the wafer and reticle stages 15 and 25 move to and stop at the alignment mark positions of the wafer 50 and the reticle 48, and thereafter, the relative position alignment between the wafer 50 and the reticle 48 is performed by an alignment system (not shown). Subsequently, the wafer and reticle stages 15 and 25 synchronously move the exposure regions of the wafer 50 and the reticle 48, for each exposure shot on the basis of the reduction magnification of the reduction projection lens and the target position command sequences $X_w[i]$ (i=1, 2, 3, . . . , n) and $X_r[i]$ (i=1, 2, 3, . . . , n) corrected in the above-mentioned relative position alignment step.

However, in the above-mentioned example, even when a position measuring device such as a laser interferometer that can respond at high speed is used, the response time required for position detection is normally several hundred nsec (nanoseconds). In particular, in a moving member such as the wafer stage 15 of the semiconductor exposure apparatus, which moves at a velocity of about 100 mm/sec, the response time delay of the position measuring device generates a position detection error.

This position detection error is as very small as several ten nm (nanometers) but is not a negligible amount since the semiconductor exposure pattern has become finer in recent years. In addition, in order to meet recent requirements for improving the throughput, the moving velocity of the stage tends to increase, and hence, the position detection error amount also tends to increase.

SUMMARY OF THE INVENTION

The present invention has been made in consideration of the above situation and has as its object to provide a position control method and apparatus, which can correct position detection errors generated due to the response delay of a position measuring device, and can actually improve the relative position alignment performance of a moving member.

It is another object of the present invention to provide a semiconductor manufacturing apparatus which can increase the moving velocity of a stage, and can shorten the processing time.

According to the present invention, a position control method for moving a moving member to a target position while measuring a position of the moving member using a position measuring device, comprises: the error information generation step of generating measurement error information associated with the position of the moving member due to a delay of measurement in the position measuring device; and the correction step of correcting a control signal for controlling movement of the moving member on the basis of the measurement error information so as to cancel an influence of the delay of measurement in the position measuring device.

In the position control method of the present invention, the error information generation step preferably includes the step of calculating the measurement error information on the basis of a moving velocity of the moving member and a delay time of measurement in the position measuring device.

In the position control method of the present invention, the error information generation step preferably includes the step of calculating the moving velocity of the moving member on the basis of a change in position information of the moving member output from the position measuring device.

In the position control method of the present invention, the error information Generation step preferably includes the step of calculating the moving velocity of the moving member on the basis of a change in control signal.

In the position control method of the present invention, the error information generation step preferably includes the step of generating the measurement error information on the basis of an offset value which is set in advance.

According to the present invention, another position control method for synchronously moving a plurality of moving members to target positions while measuring positions of the plurality of moving members using a position measuring device, comprises: the error information generation step of generating measurement error information associated with the position of each of the plurality of moving members due to a delay of measurement of the position measuring device; and the correction step of correcting control signals for controlling movements of the plurality of moving members on the basis of the measurement error information so as to cancel an influence of the delay of measurement in the position measuring device.

The other position control method of the present invention is preferably applied to control of a semiconductor manufacturing apparatus in which one of the plurality of moving members is a reticle stage for holding a reticle used in the manufacture of a semiconductor device, and the other moving member is a wafer stage for holding a semiconductor wafer.

In the other position control method of the present invention, the error information generation step preferably includes the step of calculating the measurement error information for each of the plurality of moving members on the basis of a moving velocity of each of the plurality of moving members and a delay time of measurement in the position measuring device.

In the other position control method of the present invention, the error information generation step preferably includes the step of calculating the moving velocity of each of the plurality of moving members on the basis of a change in position information of each of the plurality of moving members output from the position measuring device.

In the other position control method of the present invention, the error information generation step preferably includes the step of calculating the moving velocity of each of the plurality of moving objects on the basis of a change in control signal.

In the other position control method of the present invention, the error information generation step preferably includes the step of generating the measurement error information for each of the plurality of moving members on the basis of a plurality of offset values which are set in advance.

According to the present invention, a position control apparatus for moving a moving member to a target position while measuring a position of the moving member using a position measuring device, comprises: error information generation means for generating measurement error information associated with the position of the moving member due to a delay of measurement in the position measuring device; and correction means for correcting a control signal for controlling movement of the moving member on the basis of the measurement error information so as to cancel an influence of the delay of measurement in the position measuring device.

According to the present invention, another position control apparatus for synchronously moving a plurality of moving members to target positions while measuring positions of the plurality of moving members using a position measuring device, comprises: error information generation means for generating measurement error information associated with the position of each of the plurality of moving members due to a delay of measurement of the position measuring device; and correction means for correcting control signals for controlling movements of the plurality of moving members on the basis of the measurement error information so as to cancel an influence of the delay of measurement in the position measuring device.

According to the present invention, a semiconductor manufacturing apparatus for exposing a pattern on a reticle held by a reticle stage onto a semiconductor wafer held by a wafer stage, comprises: first driving means for driving to move the reticle stage to a target position while measuring a position of the reticle stage using a first position measuring device; second driving means for driving to move the wafer stage to a target position while measuring a position of the wafer stage using a second position measuring device; synchronous control means for arbitrating the first and second driving means so that the reticle stage and the wafer stage move synchronously; first error information generation means for generating first measurement error information associated with the position of the reticle stage due to a delay of measurement in the first position measuring device; first correction means for correcting a first control signal for controlling the driving operation of the reticle stage by the first driving means so as to cancel an influence of the delay of measurement in the first position measuring device; second error information generation means for generating second measurement error information associated with the position of the wafer stage due to a delay of measurement in the second position measuring device; and second correction means for correcting a second control signal for controlling the driving operation of the wafer stage by the second driving means so as to cancel an influence of the delay of measurement in the second position measuring device.

According to the present invention, since the control signal for controlling the movement of the moving member is corrected to cancel the influence of any measurement error of the current position of the moving member due to the delay of the measurement in the position measuring device, the moving member can be moved to the target position while accurately reflecting the current position of the moving member. Therefore, the position alignment precision of the moving member can be improved, and the moving member can be moved at high speed.

Since the measurement error is calculated based on the actual moving velocity of the moving member, the measurement error can be estimated more accurately, and even when the actual moving velocity of the moving member deviates from a setting value, the measurement error can be accurately corrected.

Since the measurement error is estimated on the basis of a change in control signal (target position) for controlling the movement of the moving member, even when the position measuring device causes an operation error due to, e.g., high-frequency noise, the control signal can be corrected based on the measurement error corresponding to the actual current position of the moving member.

In this case, when the position detection signal of the position measuring device includes many high-frequency components, the measurement error is preferably estimated based on the change in control signal (target position) to assure accurate control. On the other hand, when the actual moving velocity of the moving member largely deviates from the setting value, the measurement error is preferably estimated based on the actual moving velocity of the moving member to assure accurate control.

For example, the measurement error may be estimated in advance, and the estimated error may be set as an offset value. When the control signal is corrected on the basis of the offset value, the need for the moving velocity measuring means (e.g., a differentiator) can be obviated.

Further objects, features and advantages of the present invention will become apparent from the following detailed description of embodiments of the present invention with reference to the accompanying drawings.

DESCRIPTION OF THE PREFERRED EMBODIMENTS

Figure 1:
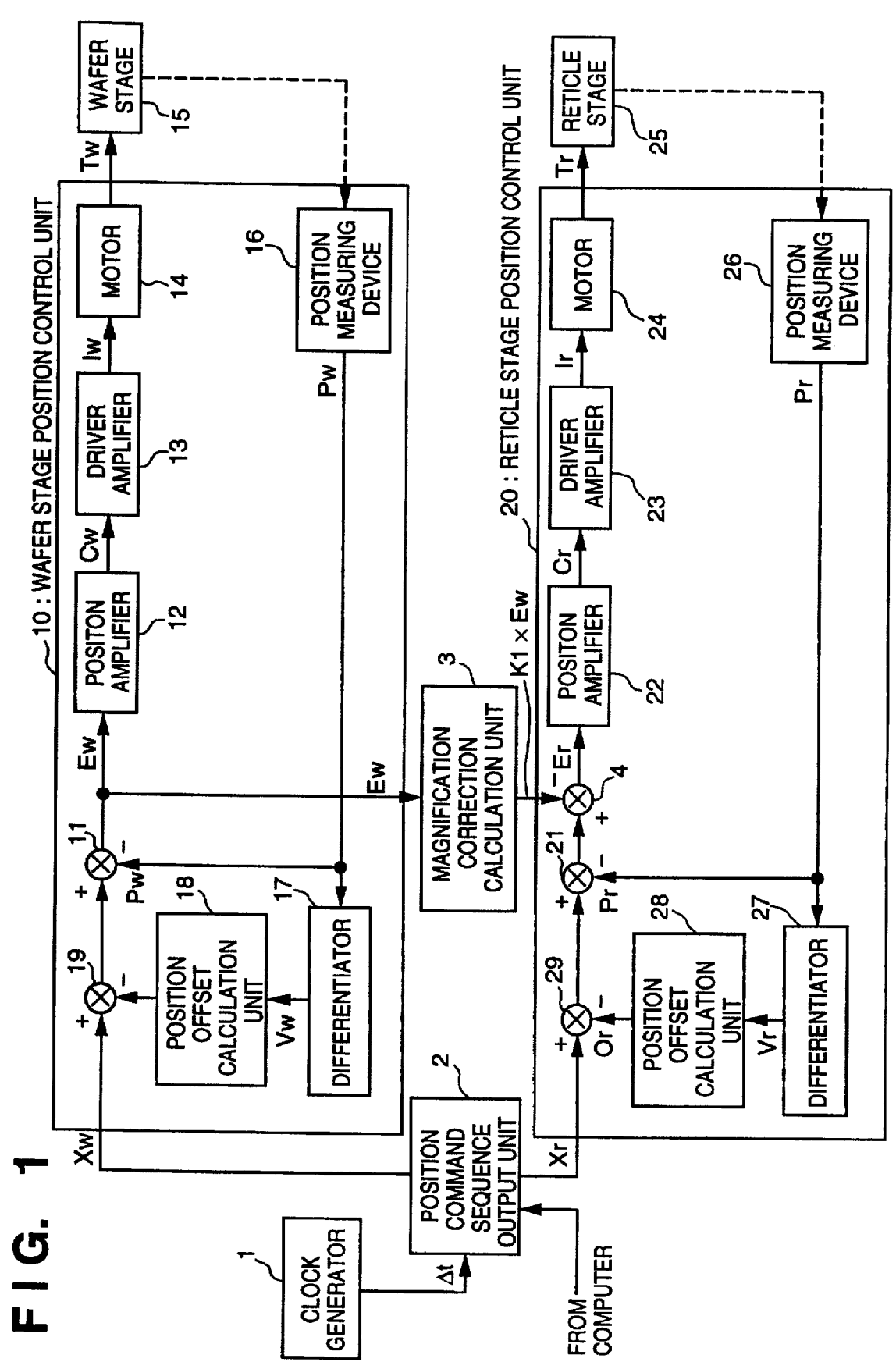
FIG. 1 is a block diagram showing the arrangement of a position control apparatus according to the first embodiment of the present invention.

FIG. 1 is a block diagram showing the arrangement of a position control apparatus for a moving member according to the first embodiment of the present invention. The same reference numerals in FIG. 1 denote the same parts as in FIG. 6. In this embodiment, differentiators 17 and 27, position offset calculation units 18 and 28, and subtracters 19 and 29 are added to the arrangement shown in FIG. 6.

In order to perform relative position alignment between a wafer stage 15 and a reticle stage 25, a host computer (not shown) inputs via a position command sequence output unit 2 position commands $X_w$ and $X_r$ for commanding the alignment mark positions of the wafer and reticle stages 15 and 25 to a wafer stage position control unit 10 and a reticle stage control unit 20.

In response to these commands, the wafer stage position control unit 10 moves the wafer stage 15 to the alignment mark position of a wafer 50 (see FIG. 5), and stops it there. Similarly, the reticle stage position control unit 20 moves the reticle stage 25 to the alignment mark position of a reticle 48 (see FIG. 5), and stops it there.

Figure 6:
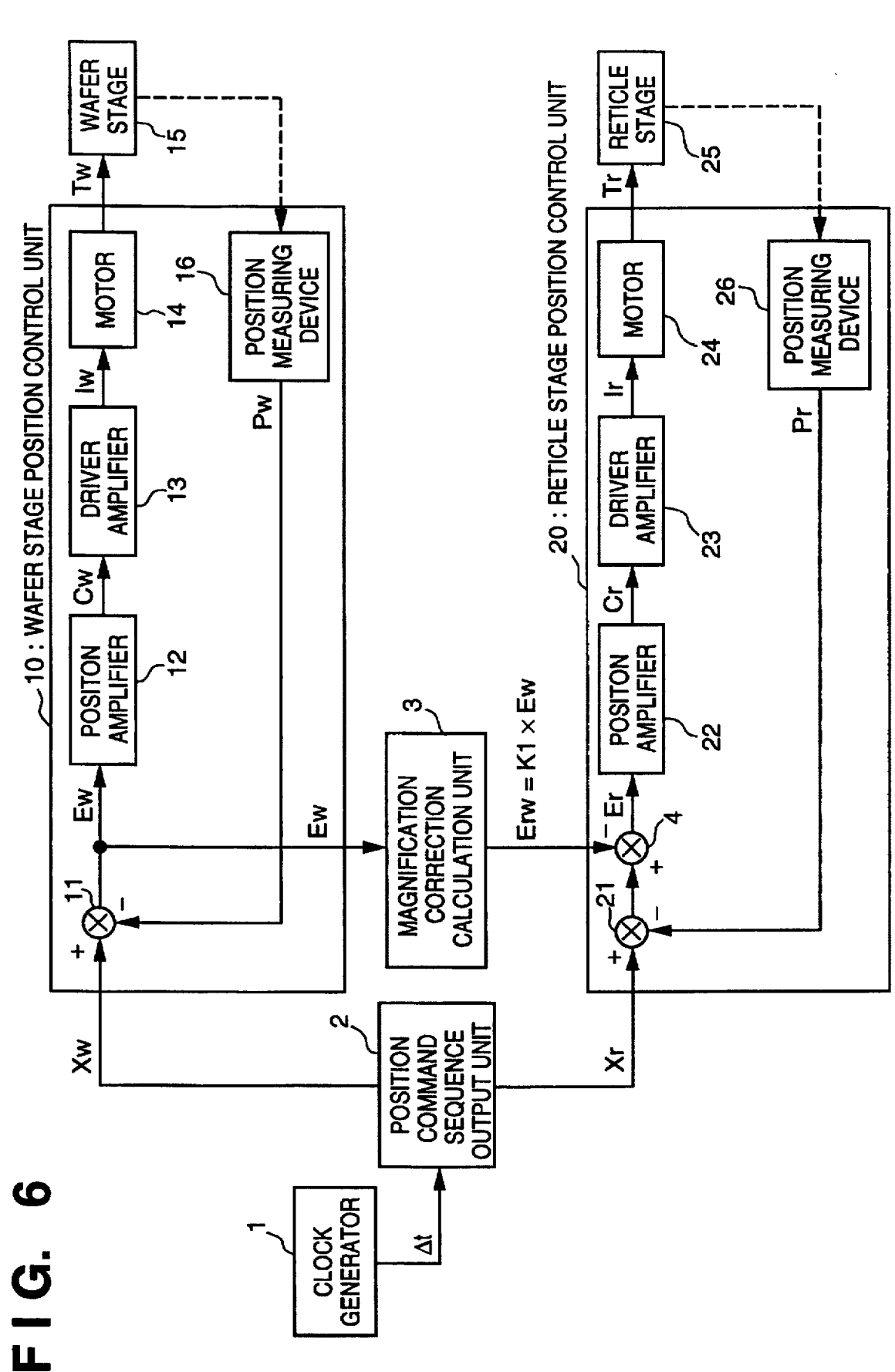
FIG. 6 is a block diagram for explaining the outline of a position control apparatus.

Since the operations of the position command sequence output unit 2, position amplifiers 12 and 22, driver amplifiers 13 and 23, and motors 14 and 24 are the same as those in the above-mentioned example shown in FIG. 6, a detailed description thereof will be omitted.

When the wafer and reticle stages 15 and 25 stop at their alignment mark positions, stage position signals $P_w$ and $P_r$ respectively output from position measuring devices 16 and 26 have values corresponding the stage positions, stage velocity signals $V_w$ and $V_r$ respectively output from differentiators 17 and 27 are zero, and offset signals $O_w$ and $O_r$ respectively output from offset calculation units 18 and 28 are zero.

After the wafer and reticle stages 15 and 25 stop, an alignment detection system (not shown) detects the alignment marks of the reticle 48 and the wafer 50, thereby detecting a relative position displacement between the wafer and reticle stages 15 and 25. Based on the detection result, the host computer calculates position command sequences $X_w[i]$ (i=1, 2, 3, ..., n) and $X_r[i]$ (i=1, 2, 3, ..., n) of the aligned exposure region.

Subsequently, the wafer and reticle stages 15 and 25 move the wafer 50 and the reticle 48 to corresponding exposure start positions $X_w[0]$ and $X_r[0]$. In the position command sequence output unit 2, the position command sequence $X_w[i]$ (i=1, 2, 3, ..., n) for commanding the target position of the exposure region of the wafer 50 and the position command sequence $X_r[i]$ (i=1, 2, 3, ..., n) for commanding the target position of the reticle 48 are set. The position command sequence output unit 2 outputs position command signals $X_w[i]$ and $X_r[i]$ to the wafer and reticle position control units 10 and 20 in accordance with clock signals periodically generated by a clock generator 1 at predetermine time intervals $\Delta t$.

The position measuring devices 16 and 26 respectively detect the current positions of the wafer and reticle stages 15 and 25, and output position signals $P_w[i]$ and $P_r[i]$. At this time, the differentiators 17 and 27 respectively calculate the values of velocity signals $V_w[i]$ and $V_r[i]$ on the basis of the wafer and reticle stage position signals $P_w[i]$ and $P_r[i]$ in accordance with, e.g., equations (3) and (4) below, and output the calculated values to the position offset calculation units 18 and 28.

$$V_w[i]=(P_w[i]-P_w[i-1])/\Delta t \tag{3}$$

$$V_r[i]=(P_r[i]-P_r[i-1])/\Delta t \tag{4}$$

The position offset calculation units 18 and 28 respectively calculate the values of position offset signals $O_w[i]$ and $O_r[i]$ on the basis of the stage velocity signals $V_w[i]$ and $V_r[i]$ in accordance with, e.g., equations (5) and (6) below, and output the calculated values to adders 19 and 29.

$$O_w[i]=V_w[i] \times T(V_w[i]) \tag{5}$$

$$O_r[i]=V_r[i] \times T(V_r[i]) \tag{6}$$

where T(V) is the detection delay time of each of the position measuring devices 16 and 26, and is a function of the stage velocity V. If the position measuring device used has a position detection delay time T(V) which does not depend on the stage velocity V and is a constant time $T_p$, equations (5) and (6) above are rewritten as the following equations (7) and (8):

$$O_w[i]=V_w[i] \times T_p \tag{7}$$

$$O_r[i]=V_r[i] \times T_p \tag{8}$$

Figure 5:
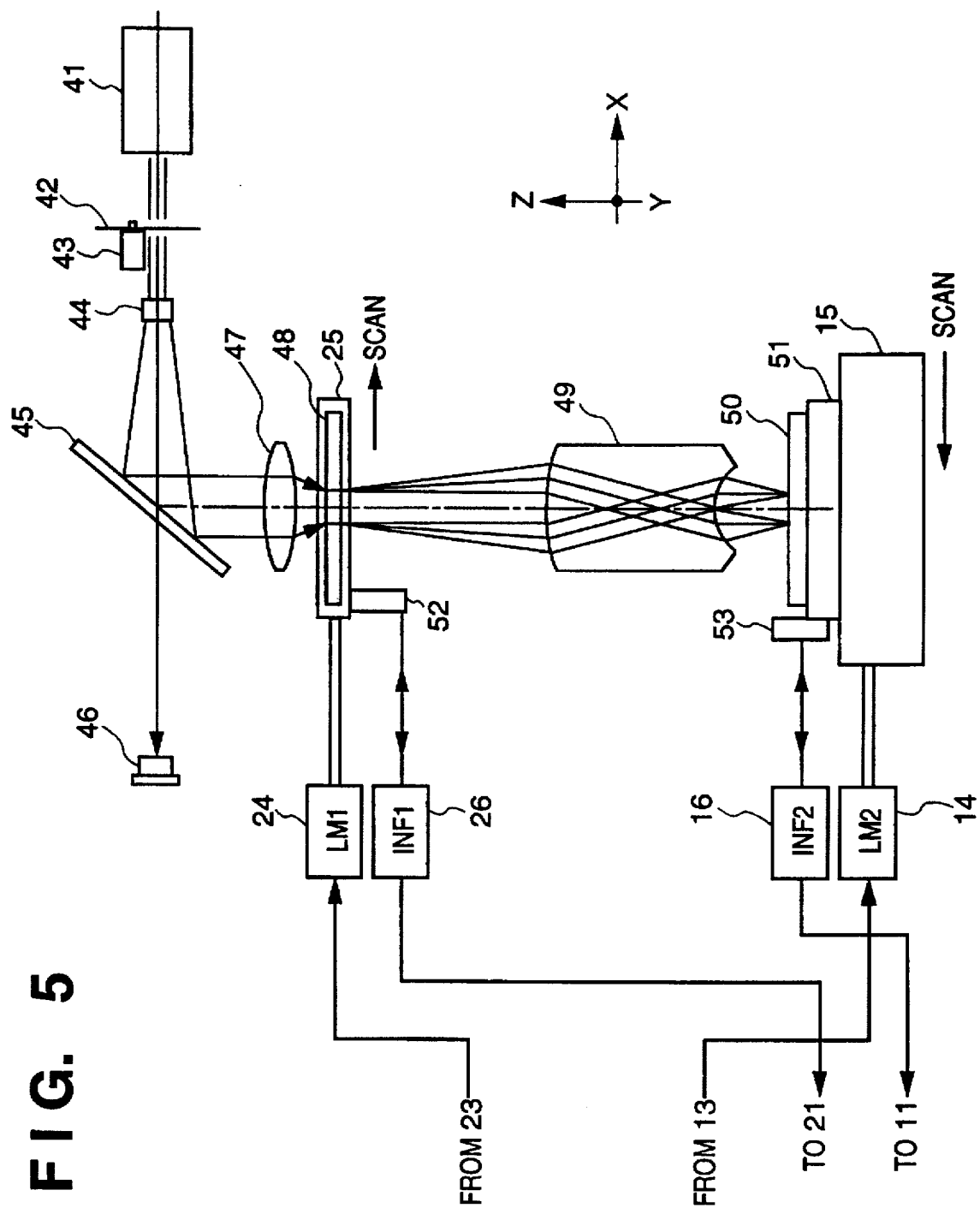
FIG. 5 is a schematic view showing the arrangement of an exposure apparatus which is used in the manufacture of semiconductors and to which the present invention can be applied.

Therefore, the values of position error signals $E_w[i]$ and $E_r[i]$ respectively input to the position amplifier 12 of the wafer stage side and the position amplifier 22 of the reticle stage side are calculated using the values of the target position signals $X_w[i]$ and $X_r[i]$, the current position signals $P_w[i]$ and $P_r[i]$, and the position offset signals $O_w[i]$ and $O_r[i]$ in accordance with the following equations (9) and (10):

$$E_w[i]=X_w[i]-P_w[i]-O_w[i] \tag{9}$$

$$E_r[i]=X_r[i]-P_r[i]-O_r[i]-K_1 \times E_w[i] \tag{10}$$

where $K_1$ is the magnification corrected in a magnification correction calculation unit 3, and is the reciprocal of the reduction ratio of a reduction exposure lens 49 (see FIG. 5). Since the operations of the position amplifiers 12 and 22, the driver amplifiers 13 and 23, and the motors 14 and 24 are the same as those in the above-mentioned example shown in FIG. 6, a detailed description thereof will be omitted. As is apparent from the above equations, subtracting the values of the position offset signals $O_w[i]$ and $O_r[i]$ from the values of the target position signals $X_w[i]$ and $X_r[i]$ amounts to adding the values of the position offset signals $O_w[i]$ and $O_r[i]$ to the values of the current position signals $P_w[i]$ and $P_r[i]$.

Figure 2:
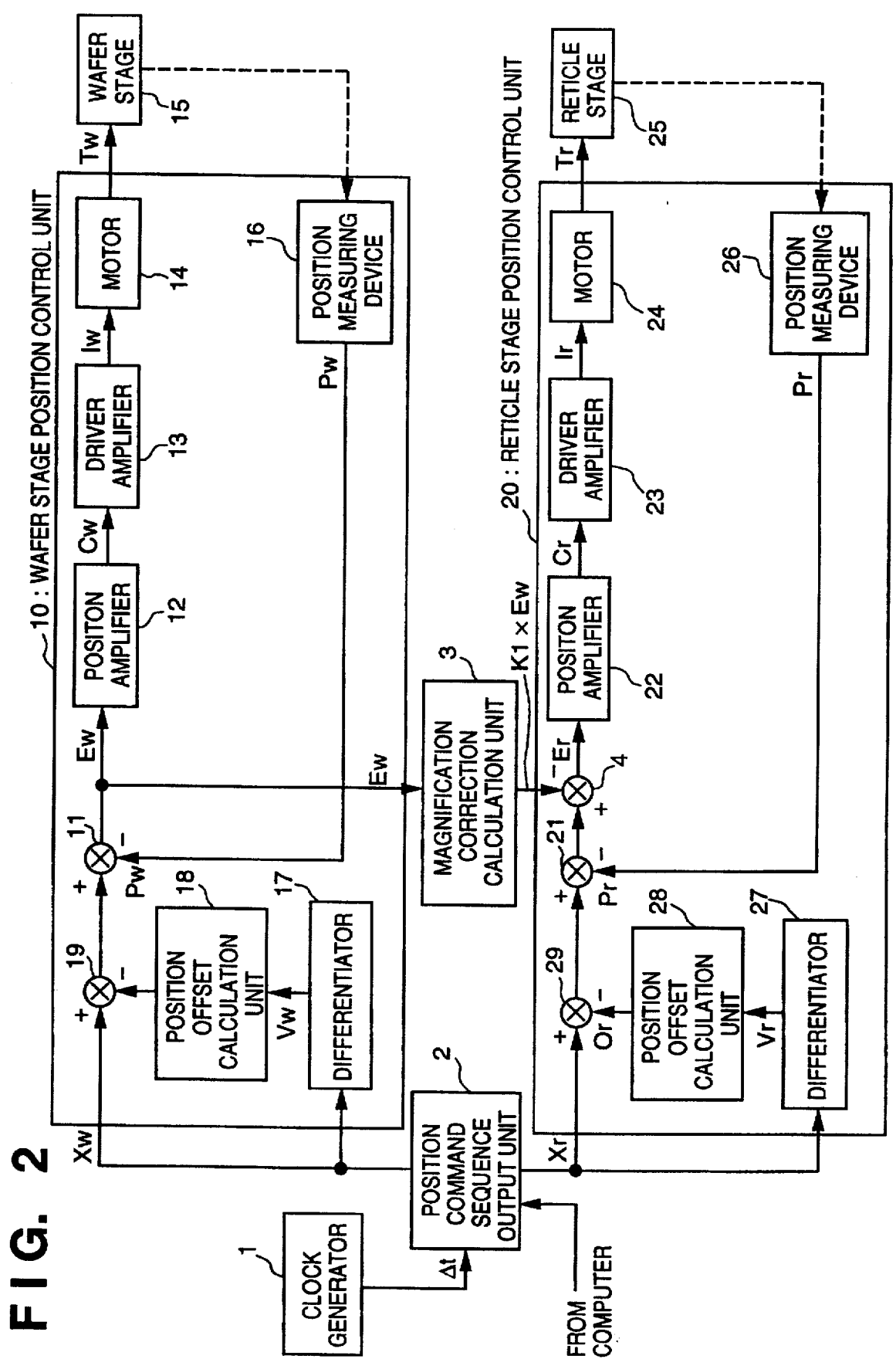
FIG. 2 is a block diagram showing the arrangement of a position control apparatus according to the second embodiment of the present invention.

FIG. 2 is a block diagram showing the arrangement of a position control apparatus for a moving member according to the second embodiment of the present invention. The same reference numerals in FIG. 2 denote the same parts as in FIG. 6. In this embodiment, differentiators 17 and 27, position offset calculation units 18 and 28, and subtracters 19 and 29 are added to the arrangement shown in FIG. 6.

In a position command sequence output unit 2, target position command sequences $X_w[i]$ (i=1, 2, 3, ..., n) and $X_r[i]$ (i=1, 2, 3, ..., n) of the exposure region calculated by a host computer are set. The position command sequence output unit 2 outputs position command signals $X_w[i]$ and $X_r[i]$ to wafer and reticle position control units 10 and 20 in accordance with clock signals periodically generated by a clock generator 1 at predetermine time intervals $\Delta t$.

Differentiators 17 and 27 respectively calculate the values of stage velocity signals $V_w[i]$ and $V_r[i]$ on the basis of the values of the target position signals $X_w[i]$ and $X_r[i]$ in accordance with equations (11) and (12) below, and output the calculated values to position offset calculation units 18 and 28.

$$V_w[i]=(X_w[i]-X_w[i-1])/\Delta t \tag{11}$$

$$V_r[i]=(X_r[i]-X_r[i-1])/\Delta t \tag{12}$$

Since other arrangements, functions, and signals are the same as those in the first embodiment shown in FIG. 1, a detailed description thereof will be omitted.

Figure 3:
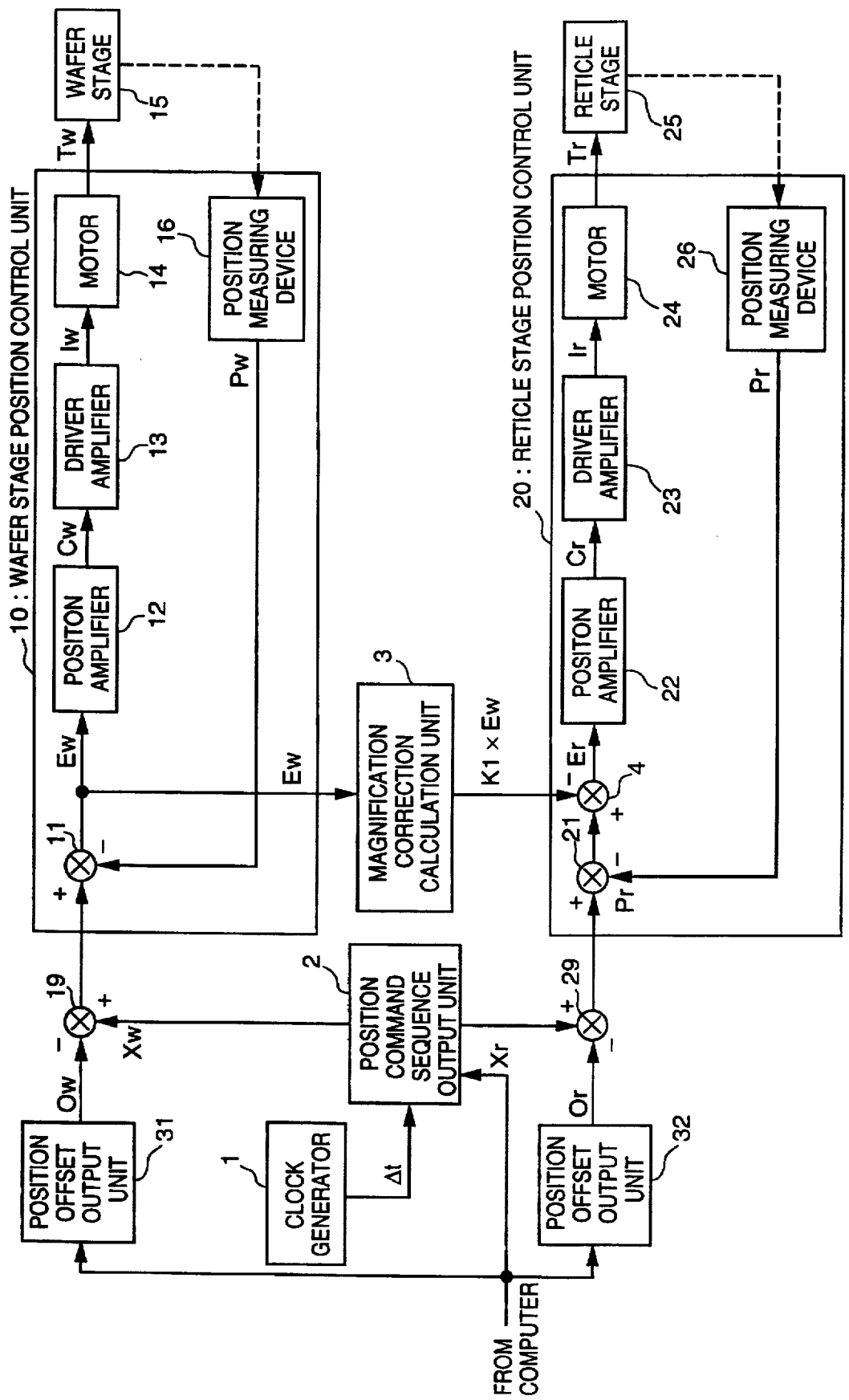
FIG. 3 is a block diagram showing the arrangement of a position control apparatus according to the third embodiment of the present invention.

FIG. 3 is a block diagram showing the arrangement of a position control apparatus for a moving member according to the third embodiment of the present invention. The same reference numerals in FIG. 3 denote the same parts as in FIG. 6. In this embodiment, position offset output units 31 and 32, and subtracters 19 and 29 are added to the arrangement shown in FIG. 6.

In a position command sequence output unit 2, target position command sequences $X_w[i]$ (i=1, 2, 3, ..., n) and $X_r[i]$ (i=1, 2, 3, ..., n) of the exposure region calculated by a host computer are set.

If the target position command sequences $X_w[i]$ and $X_r[i]$ of the exposure region correspond to constant moving velocities $V_w$ and $V_r$, the values of position offset signals $O_w[i]$ and $O_r[i]$ also assume constant values $O_w$ and $O_r$. For this reason, the offset output units 31 and 32 are set with position offset values $O_w$ and $O_r$ calculated by a host computer in accordance with, e.g., the following equations (13) to (16):

$$V_w[i]=(X_w[i]-X_w[i-1])/\Delta t \tag{13}$$

$$V_r[i]=(X_r[i]-X_r[i-1])/\Delta t \tag{14}$$

$$O_w=V_w \times T(V_w) \tag{15}$$

$$O_r=V_r \times T(V_r) \tag{16}$$

In this case, if the position detection delay time T(V) does not depend on the stage velocity V, equations (15) and (16) above are rewritten as the following equations (17) and (18):

$$O_w=V_w \times T_p \tag{17}$$

$$O_r=V_r \times T_p \tag{18}$$

Figure 4:
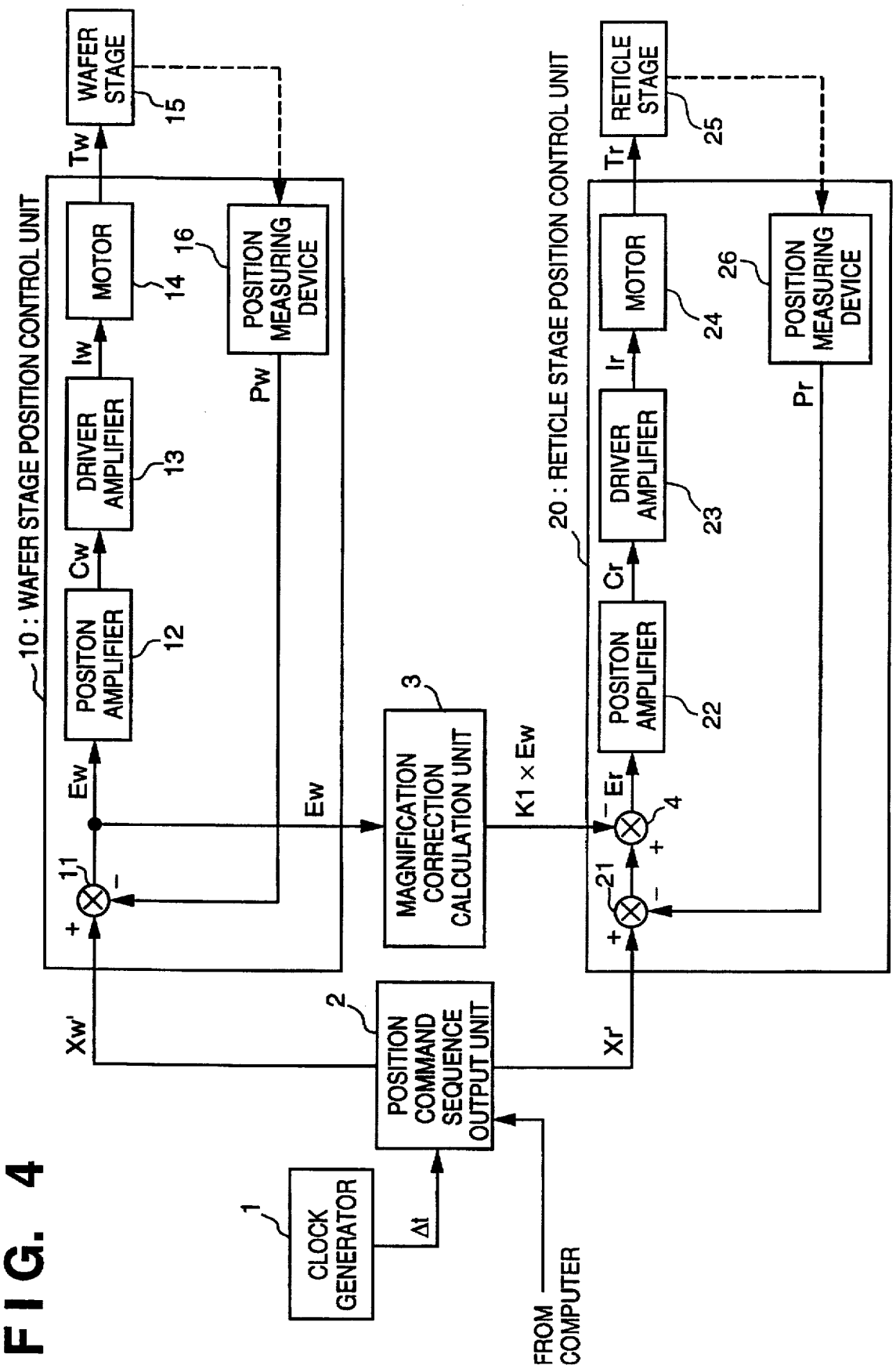
FIG. 4 is a block diagram showing the arrangement of a position control apparatus according to the fourth embodiment of the present invention.

FIG. 4 is a block diagram showing the arrangement of a position control apparatus for a moving member according to the fourth embodiment of the present invention. The same reference numerals in FIG. 4 denote the same parts as in FIG. 6. The arrangement of this embodiment is the same as that shown in FIG. 6, but target position commands output from a position command sequence output unit 2 are corrected to $X_w'$ and $X_r'$ unlike in the example shown in FIG. 6.

If $X_w[i]$ (i=1, 2, 3, ..., n) and $X_r[i]$ (i=1, 2, 3, ..., n) represent the target position command sequences of the exposure region, the target position command sequences $X_w[i]$ and $X_r[i]$ are rewritten to target position command sequences $X_w'[i]$ and $X_r'[i]$ in accordance with the following equations (19) to (24):

$$V_w[i]=(X_w[i]-X_w[i-1])/\Delta t \quad (19)$$

$$V_r[i]=(X_r[i]-X_r[i-1])/\Delta t \quad (20)$$

$$O_w=V_w \times T(V_w) \quad (21)$$

$$O_r=V_r \times T(V_r) \quad (22)$$

$$X_w'[i]=X_w[i]-O_w[i]=X_w[i]-V_w[i] \times T(V_W) \quad (23)$$

$$X_r'[i]=X_r[i]-O_r[i]=X_r[i]-V_r[i] \times T(V_R) \quad (24)$$

If the position measuring device used has a position detection delay time T(V) which is a constant time $T_p$ independently of the stage velocity V, equations (23) and (24) above are rewritten as the following equations (25) and (26):

$$X_w'[i]=X_w[i]-O_w[i]=X_w[i]-V_w[i] \times T_p \quad (25)$$

$$X_r'[i]=X_r[i]-O_r[i]=X_r[i]-V_r[i] \times T_p \quad (26)$$

As described above, according to the present invention, the position detection error amount generated by the response delay of the position measuring device is calculated, and the calculated amount is given as a correction amount of the target position of the moving member, thereby improving the position control performance of the moving member which is moving. Therefore, according to the present invention, synchronous control performance of the positions of a plurality of moving members in, e.g., scan exposure of a so-called step-and-scan type semiconductor exposure apparatus can be improved, and the exposure performance of the semiconductor exposure apparatus can be improved.

The present invention is not limited to the above embodiments and various changes and modifications can be made within the spirit and scope of the present invention. Therefore, to apprise the public of the scope of the present invention the following claims are made.

What is claimed is:

1. A position control method for moving a moving member to a target position while measuring a position of the moving member using a position measuring device, comprising:

the error information generation step of generating measurement error information associated with the position of the moving member due to a delay of measurement in the position measuring device; and the correction step of correcting a control signal for controlling movement of the moving member on the basis of the measurement error information so as to cancel an influence of the delay of measurement in the position measuring device.

2. The method according to claim 1, wherein the error information generation step includes the step of calculating the measurement error information on the basis of a moving velocity of the moving member and a delay time of measurement in the position measuring device.

3. The method according to claim 2, wherein the error information generation step includes the step of calculating the moving velocity of the moving member on the basis of a change in position information of the moving member output from the position measuring device.

4. The method according to claim 2, wherein the error information generation step includes the step of calculating the moving velocity of the moving member on the basis of a change in control signal.

5. The method according to claim 1, wherein the error information generation step includes the step of generating the measurement error information on the basis of an offset value which is set in advance.

6. A position control method for synchronously moving a plurality of moving members to target positions while measuring positions of the plurality of moving members using a position measuring device, comprising:

the error information generation step of generating measurement error information associated with the position of each of the plurality of moving members due to a delay of measurement of the position measuring device; and the correction step of correcting control signals for controlling movements of the plurality of moving members on the basis of the measurement error information so as to cancel an influence of the delay of measurement in the position measuring device.

7. The method according to claim 6, wherein one of the plurality of moving members is a reticle stage for holding a reticle used in the manufacture of a semiconductor device, and the other moving member is a wafer stage for holding a semiconductor wafer.

8. The method according to claim 6, wherein the error information generation step includes the step of calculating the measurement error information for each of the plurality of moving members on the basis of a moving velocity of each of the plurality of moving members and a delay time of measurement in the position measuring device.

9. The method according to claim 8, wherein the error information generation step includes the step of calculating the moving velocity of each of the plurality of moving members on the basis of a change in position information of each of the plurality of moving members output from the position measuring device.

10. The method according to claim 8, wherein the error information generation step includes the step of calculating the moving velocity of each of the plurality of moving objects on the basis of a change in control signal.

11. The method according to claim 6, wherein the error information generation step includes the step of generating the measurement error information for each of the plurality of moving members on the basis of a plurality of offset values which are set in advance.

12. A position control apparatus for moving a moving member to a target position while measuring a position of the moving member using a position measuring device, comprising:

error information generation means for generating measurement error information associated with the position of the moving member due to a delay of measurement in the position measuring device; and correction means for correcting a control signal for controlling movement of the moving member on the basis of the measurement error information so as to cancel an influence of the delay of measurement in the position measuring device.

13. The apparatus according to claim 12, wherein said error information generation means calculates the measurement error information on the basis of a moving velocity of the moving member and a delay time of measurement in the position measuring device.

14. The apparatus according to claim 13, wherein said error information generation means calculates the moving velocity of the moving member on the basis of a change in position information of the moving member output from the position measuring device.

15. The apparatus according to claim 13, wherein said error information generation means calculates the moving velocity of the moving member on the basis of a change in control signal.

16. The apparatus according to claim 12, wherein said error information generation means generates the measurement error information on the basis of an offset value which is set in advance.

17. A position control apparatus for synchronously moving a plurality of moving members to target positions while measuring positions of the plurality of moving members using a position measuring device, comprising:

error information generation means for generating measurement error information associated with the position of each of the plurality of moving members due to a delay of measurement of the position measuring device; and correction means for correcting control signals for controlling movements of the plurality of moving members on the basis of the measurement error information so as to cancel an influence of the delay of measurement in the position measuring device.

18. The apparatus according to claim 17, wherein one of the plurality of moving members is a reticle stage for holding a reticle used in the manufacture of a semiconductor device, and the other moving member is a wafer stage for holding a semiconductor wafer.

19. The apparatus according to claim 17, wherein said error information generation means calculates the measurement error information for each of the plurality of moving members on the basis of a moving velocity of each of the plurality of moving members and a delay time of measurement in the position measuring device.

20. The apparatus according to claim 19, wherein said error information generation means calculates the moving velocity of each of the plurality of moving members on the basis of a change in position information of each of the plurality of moving members output from the position measuring device.

21. The apparatus according to claim 19, wherein said error information generation means calculates the moving velocity of each of the plurality of moving objects on the basis of a change in control signal.

22. The apparatus according to claim 17, wherein said error information generation means generates the measurement error information for each of the plurality of moving members on the basis of a plurality of offset values which are set in advance.

23. A semiconductor manufacturing apparatus for exposing a pattern on a reticle held by a reticle stage onto a semiconductor wafer held by a wafer stage, comprising:

first driving means for driving to move the reticle stage to a target position while measuring a position of the reticle stage using a first position measuring device;

second driving means for driving to move the wafer stage to a target position while measuring a position of the wafer stage using a second position measuring device;

synchronous control means for arbitrating said first and second driving means so that the reticle stage and the wafer stage move synchronously;

first error information generation means for generating first measurement error information associated with the position of the reticle stage due to a delay of measurement in the first position measuring device;

first correction means for correcting a first control signal for controlling the driving operation of the reticle stage by said first driving means so as to cancel an influence of the delay of measurement in the first position measuring device;

second error information generation means for generating second measurement error information associated with the position of the wafer stage due to a delay of measurement in the second position measuring device; and second correction means for correcting a second control signal for controlling the driving operation of the wafer stage by said second driving means so as to cancel an influence of the delay of measurement in the second position measuring device.

24. The apparatus according to claim 23, wherein said first error information generation means calculates the first measurement error information on the basis of a moving velocity of the reticle stage and a delay time of measurement in the first position measuring device, and said second error information generation means calculates the second measurement error information on the basis of a moving velocity of the wafer stage and a delay time of measurement in the second position measuring device.

25. The apparatus according to claim 24, wherein said first error information generation means calculates the moving velocity of the reticle stage on the basis of a change in position information of the reticle stage output from the first position measuring device, and said second error information generation means calculates the moving velocity of the wafer stage on the basis of a change in position information of the wafer stage output from the second position measuring device.

26. The apparatus according to claim 24, wherein said first error information generation means calculates the moving velocity of the reticle stage on the basis of a change in first control signal, and said second error information generation means calculates the moving velocity of the wafer stage on the basis of a change in second control signal.

27. The apparatus according to claim 23, wherein said first and second error information generation means generate the first measurement error information and the second measurement error information on the basis of offset values which are set in advance.

* * * * *

UNITED STATES PATENT AND TRADEMARK OFFICE
CERTIFICATE OF CORRECTION

PATENT NO. : 5,696,590
DATED : December 9, 1997
INVENTOR(S) : YOSHINORI MAKITA

It is certified that error appears in the above-identified patent and that said Letters Patent is hereby corrected as shown below:

ON THE COVER PAGE

IN THE TITLE [54]

Line 1, "METHOD" should read --METHOD,--.

IN THE ABSTRACT [57]

Line 5, "15(25)" should read --to move--.
Line 8, "device 16(26)," should read --device,--.
Line 11, "$O_w$ $(O_r)$" should be deleted.
Line 13, "$X_w$ $(X_r)$" should be deleted.

SHEET 1 OF THE DRAWINGS

In FIG. 1, "POSITON" in boxes 12 and 22, (both occurrences), should read --POSITION--.

SHEET 2 OF THE DRAWINGS

In FIG. 2, "POSITON" in boxes 12 and 22 (both occurrences), should read --POSITION--.

UNITED STATES PATENT AND TRADEMARK OFFICE
CERTIFICATE OF CORRECTION

PATENT NO. : 5,696,590  Page 2 of 8
DATED : December 9, 1997
INVENTOR(S) : YOSHINORI MAKITA It is certified that error appears in the above-identified patent and that said Letters Patent is hereby corrected as shown below:

SHEET 3 OF THE DRAWINGS

In FIG. 3, in boxes 12 and 22, "POSITON" (both occurrences), should read --POSITION--.

SHEET 4 OF THE DRAWINGS

In FIG. 4, in boxes 12 and 22, "POSITON" (both occurrences), should read --POSITION--.

SHEET 6 OF THE DRAWINGS

In FIG. 6, in boxes 12 and 22, "POSITON" (both occurrences), should read --POSITION--.

COLUMN 1

Line 1, "METHOD" should read --METHOD,--.
Line 12, "tus" should read --tus,--.
Line 12, "apparatus" should read --apparatus,--.
Line 13, "substrate" should read --substrate,--.
Line 14, "wafer" should read --wafer,--, and "the" should read --a--.
Line 25, "15," should read --15 denotes--.
Line 30, "16" should read --16,--.
Line 48, "25," should read --25 denotes--.

UNITED STATES PATENT AND TRADEMARK OFFICE
CERTIFICATE OF CORRECTION

PATENT NO. : 5,696,590

DATED : December 9, 1997

INVENTOR(S) : YOSHINORI MAKITA

It is certified that error appears in the above-identified patent and that said Letters Patent is hereby corrected as shown below:

COLUMN 2

Line 3, "42," should read --42 denotes--.
    Line 5, "44," should read --44 denotes--, and "45," should read --45 denotes--.
    Line 6, "46," should read --46 denotes--.
    Line 7, "47," should read --47 denotes--.
    Line 8, "the exposure light onto" should be deleted.
    Line 9, "48." should read --48 with the exposure light.--.
    Line 65, "device" should read --device,--.
    Line 66, "speed" should read --speed,--.

COLUMN 3

Line 35, "an" should read --the--.
    Line 40, "the" (first occurrence), should be deleted.
    Line 41, "a" (both occurrences), should read --the--.
    Line 51, "Generation" should read --generation--.
    Line 53, "in" should read --in a--.
    Line 62, "the" should read --an--.
    Line 65, "a" should read --the--.
    Line 66, "the" should read --a--.

UNITED STATES PATENT AND TRADEMARK OFFICE
CERTIFICATE OF CORRECTION

PATENT NO. : 5,696,590

DATED : December 9, 1997

INVENTOR(S) : YOSHINORI MAKITA

It is certified that error appears in the above-identified patent and that said Letters Patent is hereby corrected as shown below:

COLUMN 4

Line 2, "an" should read --the--.
    Line 15, "a" should read --the--.
    Line 16, "a" should read --the--.
    Line 29, "in" should read --in the--.
    Line 45, "an" should read --the--.

Line 54, "a" should read --the--.
    Line 58, "an" should read --the--.
    Line 65, "a" (first occurrence), should read --the--.
    Line 67, "a" (second occurrence), should read --the--.

COLUMN 5

Line 7, "a" should read --the--.
    Line 10, "an" should read --the--.
    Line 14, "a" should read --the--.
    Line 18, "an" should read --the--.
    Line 38, "in" should read --in a--.
    Line 47, "in" should read --in a--.

COLUMN 6

Line 29, "inputs" should read --inputs,--.
    Line 30, "2" should read --2,--.

UNITED STATES PATENT AND TRADEMARK OFFICE
CERTIFICATE OF CORRECTION

PATENT NO. : 5,696,590

DATED : December 9, 1997

INVENTOR(S) : YOSHINORI MAKITA

It is certified that error appears in the above-identified patent and that said Letters Patent is hereby corrected as shown below:

COLUMN 7

Line 7, "mine" should read --mined--.

COLUMN 8

Line 12, "predetermine" should read --predetermined--.
Line 66, "$X_r'$" should read --$X_r'$, --.

COLUMN 9

Line 45, "a" (second occurrence) should read --the--.
Line 48, "the" should read --an--.
Line 52, "the" should read --a--.
Line 55, "an" should read --the--.
Line 57, "the" should read --said--.
Line 59, "a" should read --the--.
Line 60, "a" should read --the--.
Line 62, "the" should read --said--.

UNITED STATES PATENT AND TRADEMARK OFFICE
CERTIFICATE OF CORRECTION

PATENT NO. : 5,696,590  Page 6 of 8
DATED : December 9, 1997
INVENTOR(S) : YOSHINORI MAKITA It is certified that error appears in the above-identified patent and that said Letters Patent is hereby corrected as shown below:

COLUMN 10

Line 1, "the" should read --said--.
Line 4, "in" should read --in the--.
Line 5, "the" should read --said--.
Line 11, "positions" should read --the positions--.
Line 13, "the" should read --an--.
Line 18, "the" should read --a--.
Line 19, "movements" should read --the movements--.
Line 21, "an" should read --the--.
Line 26, "the other" should read --another--.
Line 28, "the" should read --said--.
Line 31, "a" should read --the--.
Line 32, "a" should read --the--.
Line 34, "the" should read --said--.
Line 40, "the" should read --said--.
Line 43, "in control signal." should read --in the control signals.--.
Line 44, "the" should read --said--.
Line 50, "a" (second occurrence) should read --the--.
Line 59, "an" should read --the--.
Line 64, "a" should read --the--.
Line 65, "a" should read --the--.

UNITED STATES PATENT AND TRADEMARK OFFICE
CERTIFICATE OF CORRECTION

PATENT NO. : 5,696,590
DATED : December 9, 1997
INVENTOR(S) :
YOSHINORI MAKITA

It is certified that error appears in the above-identified patent and that said Letters Patent is hereby corrected as shown below:

COLUMN 11

Line 6, "in" should read --in the--.
Line 14, "positions" should read --the positions--.
Line 22, "movements" should read --the movements--.
Line 24, "an" should read --the--.
Line 29, "the other" should read --another--.
Line 34, "a" should read --the--.
Line 35, "a" should read --the--.
Line 46, "in control signal." should read --in the control signals.--.
Line 55, "for driving" should read --for performing a driving operation--.
Line 56, "a" (second occurrence) should read --the--.

UNITED STATES PATENT AND TRADEMARK OFFICE
CERTIFICATE OF CORRECTION

PATENT NO. : 5,696,590

DATED : December 9, 1997

INVENTOR(S) : YOSHINORI MAKITA

It is certified that error appears in the above-identified patent and that said Letters Patent is hereby corrected as shown below:

COLUMN 12

Line 1, "for driving" should read --for performing a driving operation--.
Line 2, "a" (second occurrence) should read --the--.
Line 14, "an" should read --the--.
Line 28, "a" should read --the--.
Line 29, "a" should read --the--.
Line 32 "a" should read --the--.
Line 33, "a" should read --the--.
Line 46, "in" should read --in a--.
Line 49, "in" should read --in a--.

Signed and Sealed this

Eleventh Day of August 1998

Attest:

BRUCE LEHMAN

Attesting Officer

Commissioner of Patents and Trademarks